(12) United States Patent
Saito et al.

(10) Patent No.: US 11,799,042 B2
(45) Date of Patent: Oct. 24, 2023

(54) SOLAR PANEL, ELECTRONIC DEVICE, AND ELECTRONIC TIMEPIECE

(71) Applicant: CASIO COMPUTER CO., LTD., Tokyo (JP)

(72) Inventors: Yuta Saito, Tachikawa (JP); Takashi Sano, Fussa (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 17/070,178

(22) Filed: Oct. 14, 2020

(65) Prior Publication Data

US 2021/0111292 A1    Apr. 15, 2021

(30) Foreign Application Priority Data

Oct. 15, 2019 (JP) ................................. 2019-188385

(51) Int. Cl.
*H01L 31/00* (2006.01)
*H01L 31/0468* (2014.01)
(Continued)

(52) U.S. Cl.
CPC .......... *H01L 31/0468* (2014.12); *G04C 10/02* (2013.01); *H01L 31/022425* (2013.01); *G04G 21/04* (2013.01); *H01Q 1/273* (2013.01)

(58) Field of Classification Search
CPC ......... H01L 31/0468; H01L 31/022425; H01L 31/042; H01L 31/0465; G04C 10/02;
(Continued)

(56) References Cited

U.S. PATENT DOCUMENTS 6,791,905 B1 * 9/2004 Sekiguchi .............. G04C 10/02
368/80
2014/0232603 A1 * 8/2014 Fujisawa .................. H01Q 1/24
343/702
(Continued)

FOREIGN PATENT DOCUMENTS

EP          2275884 A2 *  1/2011    ............. G04C 10/02
JP       2001-267603 A      9/2001
(Continued)

OTHER PUBLICATIONS

O'Conchubhair, O. (2015). Integration of Antennas and Solar cells for Low Power Wireless Systems. Doctoral Thesis, Technological University Dublin. doi:10.21427/D74W3J (Year: 2015).*
(Continued)

*Primary Examiner* — Angelo Trivisonno
(74) *Attorney, Agent, or Firm* — Scully, Scott, Murphy & Presser, P.C.

(57) ABSTRACT

Disclosed is a solar panel being divided into a plurality of cells and including: a light transmissive power generation region which is a central region in a diameter direction of a ring-shaped member and in which extending thin line power generators are arranged in parallel in a direction substantially orthogonal to the extending direction; and a periphery power generation region which is a periphery region of the light transmissive power generation region and in which a part of the cells is arranged along a circumferential direction. The cells include a composite cell including at least a part of the periphery power generation region and at least a part of the light transmissive power generation region. A first cell and a second cell different from the first cell are respectively arranged on one end side and on the other end side in the diameter direction of the ring-shaped member.

8 Claims, 4 Drawing Sheets

(51) Int. Cl.
  *G04C 10/02* (2006.01)
  *H01L 31/0224* (2006.01)
  *G04G 21/04* (2013.01)
  *H01Q 1/27* (2006.01)

(58) Field of Classification Search
  CPC ........ G04G 21/04; H01Q 1/273; Y02E 10/52;
  G04R 60/08
  See application file for complete search history.

(56) References Cited

U.S. PATENT DOCUMENTS

2016/0204292 A1\* 7/2016 Saito .................. H01L 31/042
  136/246
2018/0287248 A1\* 10/2018 Han ...................... H01Q 1/48
2019/0137951 A1\* 5/2019 Uematsu ............... G04B 39/00

FOREIGN PATENT DOCUMENTS

| JP | 2001267603 A | \* | 9/2001 |
| JP | 2016-519442 A | | 6/2016 |
| JP | 2019-086415 A | | 6/2019 |

OTHER PUBLICATIONS

JP 2001-267603 A, English machine translation (Year: 2022).\*
O'Conchubhair, O. (2015). Integration of Antennas and Solar cells for Low Power Wireless Systems. Doctoral Thesis, Technological University Dublin. doi:10.21427/D74W3J (Year: 2015).\*
Notice of Reasons for Refusal dated Oct. 19, 2021 received in Japanese Patent Application No. JP 2019-188385 together with an English language translation.

\* cited by examiner

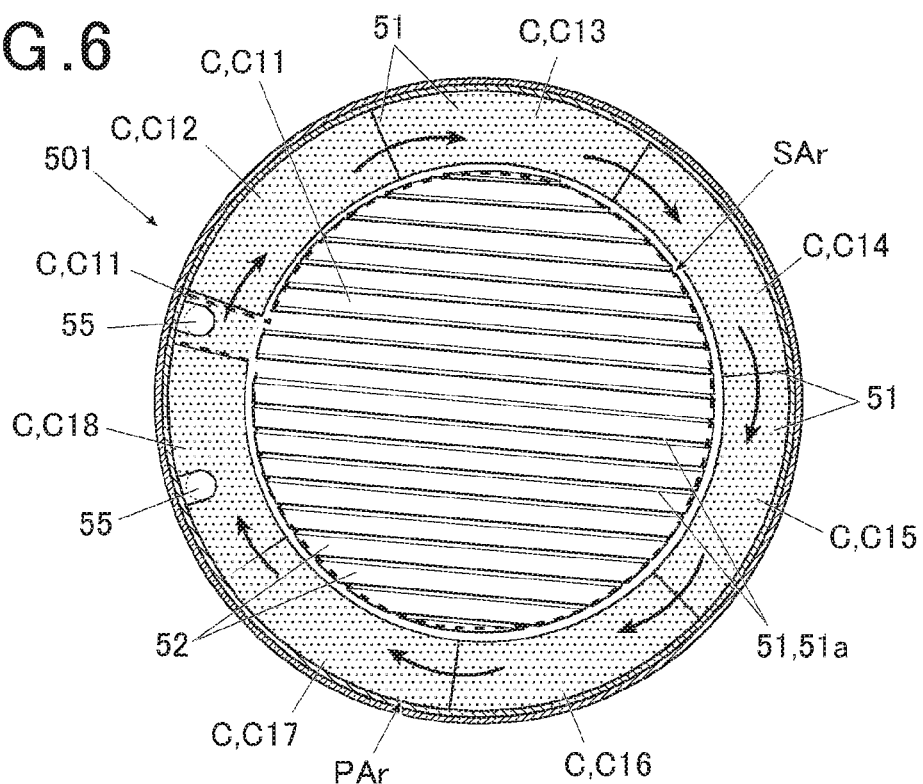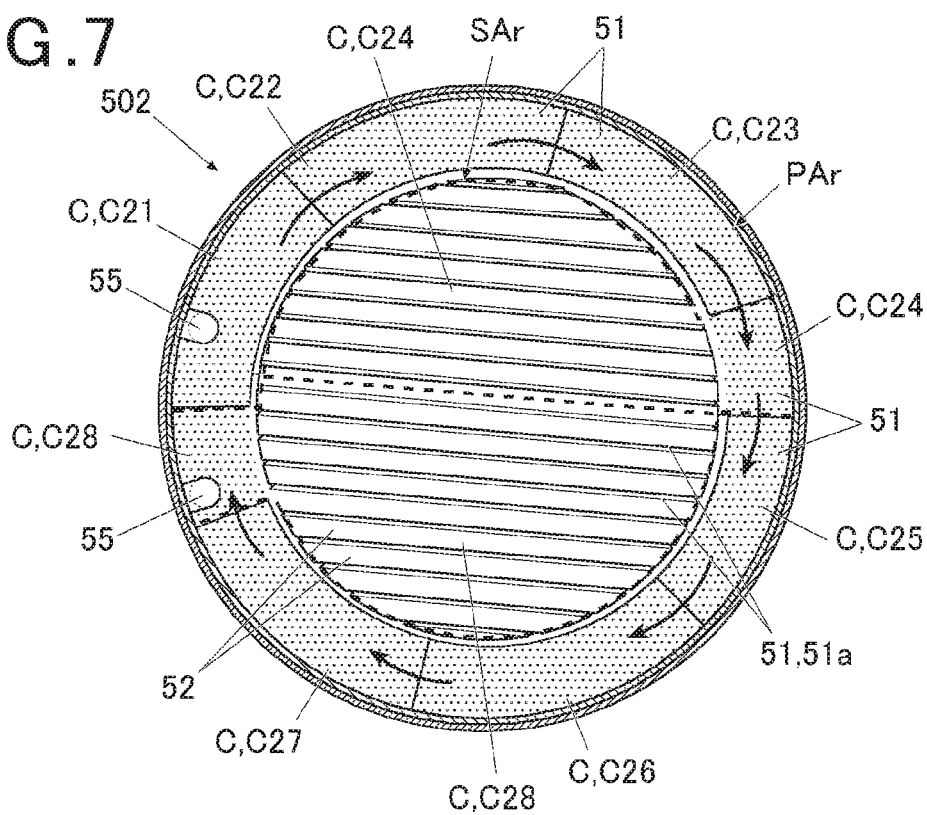

SOLAR PANEL, ELECTRONIC DEVICE, AND ELECTRONIC TIMEPIECE

CROSS-REFERENCE TO RELATED APPLICATION

This application is based upon and claims the benefit of priority from the prior Japanese Patent Application No. 2019-188385, filed on Oct. 15, 2019, the entire contents of which are incorporated herein by reference.

BACKGROUND

Technical Field

The present disclosure relates to a solar panel, an electronic device, and an electronic timepiece.

Background Art

Conventionally, there has been widely known electronic devices (electronic timepieces) such as watches and clocks including solar panels that receive light and generate electric power.

The demand for a larger amount of electric power generated by the solar panel has been increased as various electronic devices become more sophisticated in recent years.

Thus, it has been proposed to arrange the power generation part also in a portion providing a display unit in the electronic device to efficiently generate the power. For example, JP 2016519442 A describes integrating, into a display device, a solar panel which is provided with a light transmissive power generation region that is configured not to be easily seen from outside.

By such a technique, it is possible to secure visibility of the display unit even when the solar panel is arranged on the display unit, and thus it is possible to realize both of the increase in power generation amount and the good displaying.

The light transmissive power generation region is configured in a stripe pattern by alternately arranging a power generation part formed in a thin line shape and a light transmissive part which transmits light, for example.

The solar panel is divided into a plurality of cells in order to adjust the voltage. When there is a portion formed in a stripe pattern as descried above, the solar panel is divided along the extending direction of the stripe so as to make the dividing line less noticeable. Thus, each cell is formed in a strip shape, and the cells are connected to form the solar panel.

SUMMARY

According to an aspect of the present invention, there is provided a solar panel which is divided into a plurality of cells, the solar panel including: a light transmissive power generation region which is a central region in a diameter direction of a ring-shaped member and in which thin line power generators extending in an extending direction are arranged in parallel in a direction substantially orthogonal to the extending direction, the ring-shaped member being arranged near the solar panel and resonating with radio waves of a certain frequency; and a periphery power generation region which is a periphery region of the light transmissive power generation region and in which a part of the cells is arranged along a circumferential direction. The cells include a composite cell that includes at least a part of the periphery power generation region and at least a part of the light transmissive power generation region. A first cell among the cells is arranged on one end side in the diameter direction of the ring-shaped member, and a second cell different from the first cell among the cells is arranged on the other end side in the diameter direction.

BRIEF DESCRIPTION OF THE DRAWINGS

The accompanying drawings are not intended as a definition of the limits of the invention but illustrate embodiments of the invention, and together with the general description given above and the detailed description of the embodiments given below, serve to explain the principles of the invention, wherein:

FIG. 6 is a schematic plan view of a modification example of a solar panel; and

FIG. 7 is a schematic plan view of a modification example of a solar panel.

DESCRIPTION OF EMBODIMENTS

With reference to FIGS. 1 to 5, the description is made for an embodiment of a solar panel according to the present invention and an electronic timepiece as an electronic device to which the solar panel is applied.

The embodiment described below is provided with various limitations technically preferable for carrying out the present invention. However, the scope of the present invention is not limited to the embodiment below or illustrated examples.

Figure 1:
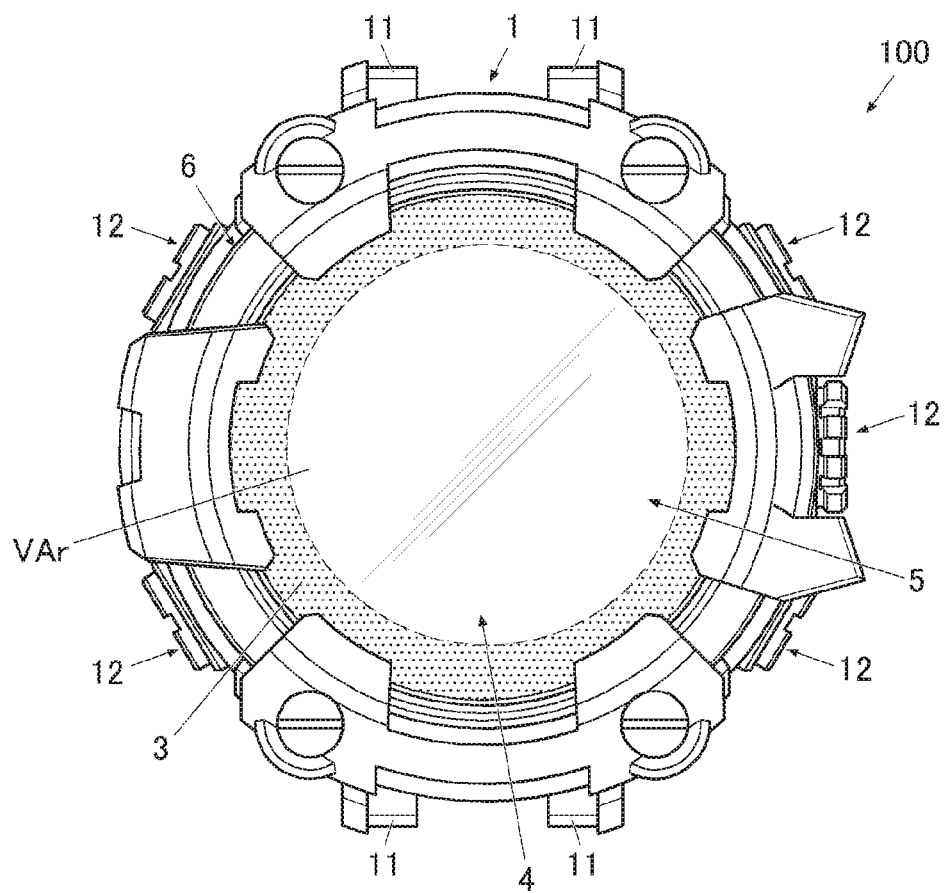
FIG. 1 is a front view of a timepiece in the present embodiment.

FIG. 1 is a front view showing an electronic timepiece (hereinafter, merely referred to as a "timepiece") as an electronic device in the present embodiment.

As shown in FIG. 1, a timepiece 100 in the present embodiment includes a case (hereinafter, referred to as a "body case 1" in the embodiment). The body case 1 is formed of a hard material such as a hard synthetic resin or a metal such as titanium and stainless steel (SUS), for example. The material forming the body case 1 is not limited to the examples described above.

The body case 1 in the present embodiment is formed in a hollow short column shape which is open on the upper and lower sides in the case thickness direction (front and back sides of the timepiece).

Band attachments 11 to which a wrist band not shown in the drawings is attached are provided at both upper and lower ends in FIG. 1 of the body case 1, that is, at the end on 12 o'clock side and at the end on 6 o'clock side of an analog type timepiece.

The timepiece 100 also includes operation buttons 12 on lateral sides of the body case 1. In the example shown in FIG. 1, a total of five operation buttons 12 are arranged, two of the operation buttons 12 being arranged on the left side of the body case 1 and three of the operation buttons 12 being arranged on the right side.

A back cover which closes the open part and is not shown in the drawings is attached to the back surface side of the body case 1.

A bezel 6 in a ring shape is arranged as a ring-shaped member on the upper section (visible side in the timepiece 100, front surface side) of the outer side of the body case 1.

The bezel 6 in the present embodiment is configured to resonate with radio waves of a desired frequency, and functions as an antenna (bezel antenna). The bezel 6 is connected to a receiving circuit 65 which is mounted on a circuit substrate (not shown in the drawings) via a connector not shown in the drawings. The bezel 6 is configured to receive radio waves of a frequency which is set. For example, the bezel 6 is adjusted so as to be able to receive radio waves which are transmitted from a GPS (Global Positioning System) satellite as mentioned later, and the bezel 6 is assembled to the body case 1 of the timepiece 100. The bezel 6 acts as a circularly polarized wave antenna which receives radio waves of a circularly polarized wave (right-handed circularly polarized wave when GPS radio waves are received) of a certain wavelength.

The bezel 6 in the present embodiment is configured as an antenna with a single power feeding point, and preferably, a power feeding point 62 is provided at any position shown by the shaded circle 62 in FIG. 3 as mentioned later.

The radio waves of a desired frequency which can be received by the bezel 6 that functions as the antenna include radio waves transmitted from a satellite.

For example, the frequency of radio waves from the GPS satellite and radio waves transmitted from QZSS which is the Japanese quasi-zenith satellite is 1575.42 MHz, and the radio waves transmitted from GLONASS (Global Navigation Satellite System) are in the frequency band centered at 1602.5625 MHz.

Thus, for example, when the bezel 6 is configured to be able to resonate with the radio waves of frequency 1575.42 MHz corresponding to the above GPS and the like or the radio waves of frequency 1602.5625 MHz corresponding to GLONASS, it is possible to receive the radio waves transmitted from GPS or GLONASS. Thus, it is possible to use time information and position information contained in these radio waves in the timepiece 100.

In the present embodiment, the bezel 6 functions as an antenna which can receive the radio waves of a desired frequency by appropriately setting the bezel 6 and other various conditions.

The radio waves of a desired frequency which can be received by the bezel 6 that functions as an antenna are not limited to the radio waves transmitted from the GPS satellite or the like.

In the present embodiment, the bezel 6 is formed in a ring shape by a metal material such as SUS 316 (stainless steel 316), for example.

The material to form the bezel 6 is not limited to SUS 316.

In the present embodiment, the bezel 6 is configured to function as an antenna that resonates with the radio waves of a desired frequency as mentioned above. As for this point, it is considered that the sufficient antenna gain cannot be obtained when the conductivity of the material forming the bezel 6 is low (when resistivity is high).

Thus, in order to make the bezel 6 function as the antenna which has a good antenna gain, it is preferable to use a metal material which has a conductivity of a certain level or more (that is, resistivity is at a certain level or less), and has a magnetic permeability of a certain level or less, as the material to form the bezel 6.

The material to form the bezel 6 may be set as needed by the frequency of radio waves to be received by the bezel 6 as the antenna and other various conditions, and thus not limited to the examples described above.

Figure 2:
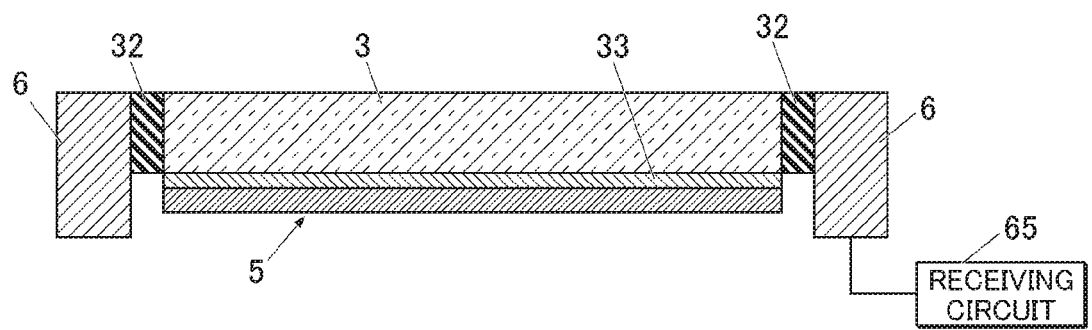
FIG. 2 is a schematic main part sectional view of the timepiece in the present embodiment.

FIG. 2 is a schematic main part sectional view of the timepiece shown in FIG. 1.

FIG. 2 schematically shows the main parts in the upper portion of the timepiece 100 (visible side, front surface side of the timepiece 100) as a cross section.

As shown in FIG. 2, a windshield member 3 is provided inside the bezel 6 via a sealing ring 32 which is formed of a resin or the like.

The windshield member 3 is formed of a transparent glass, resin or the like, and has a light transmitting property. By the windshield member 3 being fitted to the bezel 6 via the sealing ring 32, the opening on the front surface side of the body case 1 (visible side and upper side of the timepiece) is closed while keeping airtight.

In the present embodiment, it is preferable that the peripheral portion on the lower surface side (side arranged inside the body case 1) of the windshield member 3 is a decoration part in a ring shape (not shown in the drawings). By providing an overall pattern, coloring or the like to the entire decoration part by a method not obstructing the light transmitting property and providing various types of characters such as logos, symbols and marks as the decoration part, it is possible to have a blindfold function that covers the connection parts and the like on the periphery of the display unit 4, the solar panel 5 and the like contained inside the body case 1 so that the connection parts and the like are not visible from outside.

The method for forming the decoration part is not particularly limited, and the decoration part is formed by performing printing, various types of vapor deposition or the like to the lower surface of the windshield member 3, for example.

A module (timepiece module including a time counting circuit as a time counting unit that executes time counting processing, not shown in the drawings) that operates the units of the timepiece 100 as an electronic device is contained inside the body case 1 in the present embodiment.

The display unit 4 which includes an LCD (Liquid Crystal Display), an organic electroluminescence display, other flat displays or the like is provided between the upper side (visible side, front surface side of the timepiece) of the module and the windshield member 3. When the display unit 4 includes the liquid crystal display, the display may be a reflection type liquid crystal display or may be a transmitting type liquid crystal display by a back light. The display unit 4 is arranged on the lower side (that is, nonvisible side) of the after-mentioned solar panel 5. Though not shown in FIG. 1, time and various types of information are displayed on the display unit 4.

The configuration of the display unit 4 is not particularly limited, and the display unit 4 may include an analog type display unit which includes a dial plate, hands and the like. The display unit 4 may include both of the analog type display unit and a digital type display unit configured by including a liquid crystal panel or the like.

As mentioned above, the periphery (edge of periphery and the like) of the display unit 4 is covered with the decoration part and not visible from the outside.

In the present embodiment, the region inside the decoration part (nearly circle region indicated by a white central region in FIG. 1) is a visible region VAr that is visible from outside in the display unit 4.

The solar panel 5 is arranged between the display unit 4 and the windshield member 3. The solar panel 5 includes power generators 51 (including thin line power generators 51a) each of which functions as a solar cell that generates electric power by receiving light. The electric power which was obtained by optical power generation with the solar panel 5 is stored in a secondary cell not shown in the drawings.

In the present embodiment, as indicated by a broken line in FIG. 1, the solar panel 5 is arranged in a superposition manner on the visible side (front surface side of the timepiece 100) of the display unit 4. To be specific, as shown in FIG. 2, the solar panel 5 is arranged on the back surface side of the windshield member 3 by a double-sided tape 33. Thus, as shown in FIG. 3, the solar panel 5 is arranged near (inside, in the present embodiment) the bezel 6. The method for attaching the solar panel 5 is not limited to the double-sided tape 33.

Figure 3:
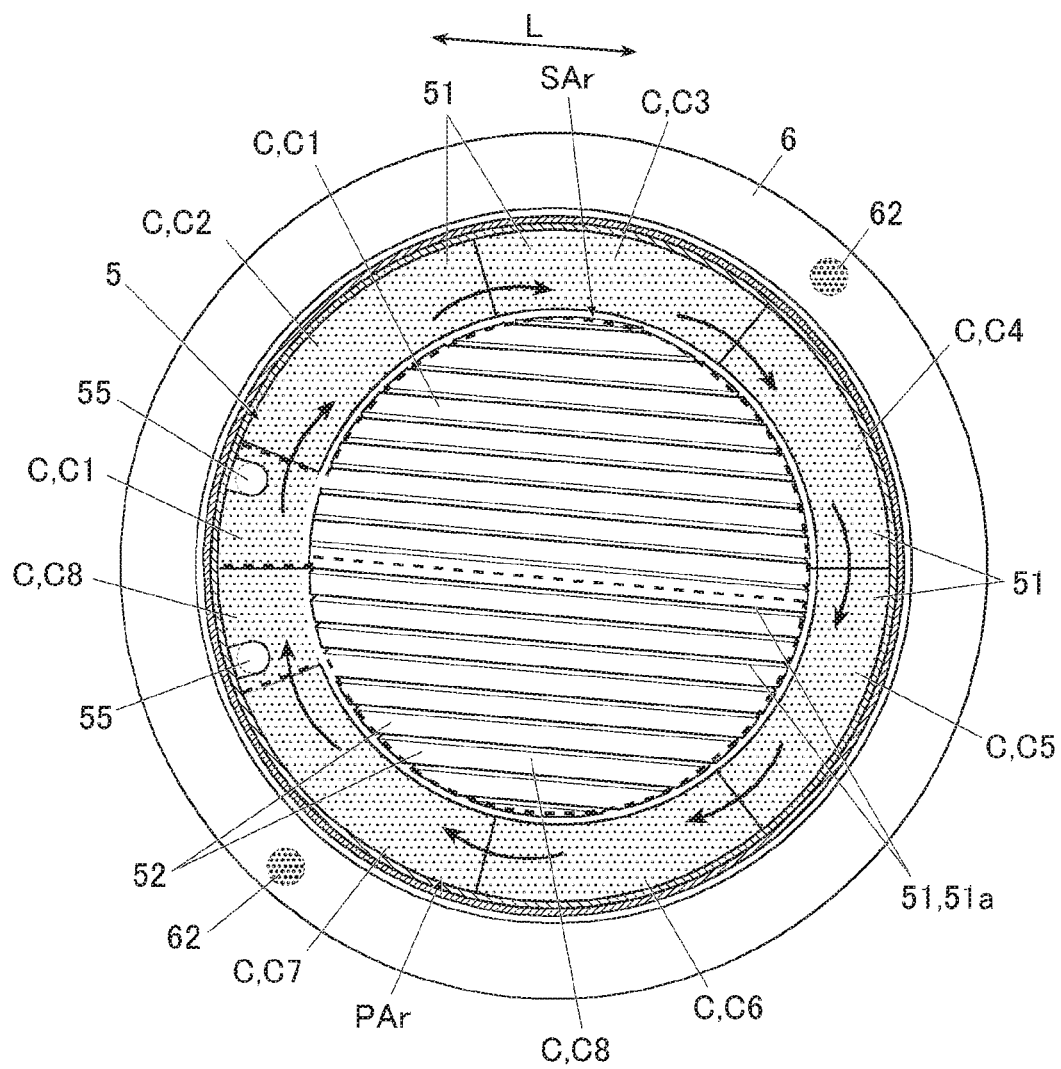
FIG. 3 is a schematic plan view of a bezel and a solar panel.

FIG. 3 is a plan view schematically showing the state in which the solar panel is arranged inside the bezel. FIG. 3 is a schematic image, and does not strictly reproduce the actual shape as for the positions of lines dividing respective blocks described later, thickness and the number of thin line power generators 51a, or the like.

As shown in FIG. 3, the solar panel 5 in the present embodiment includes a light transmissive power generation region SAr which is a central region in a diameter direction of the bezel 6 that is a ring-shaped member, and a periphery power generation region PAr which is a periphery region of the light transmissive power generation region SAr and in which parts of a plurality of solar cells C (blocks forming the solar cells C) are arranged along the circumferential direction. The solar panel 5 is divided into a plurality of cells (solar cells C).

The light transmissive power generation region SAr is a region in which the thin line power generators 51a that are the power generators 51 in thin line shapes extending in a certain direction (extending direction L) are arranged in parallel in a direction orthogonal to the extending direction L. In the light transmissive power generation region SAr, the thin line power generators 51a and transmissive regions 52 which transmit light are alternately arranged at a fixed pitch.

In the present embodiment, at least a part of the solar cells C which is arranged to correspond to the above-mentioned visible region VAr visible from outside is formed as the light transmissive power generation region SAr.

By using the uniform pitch for the thin line power generators 51a arranged in the light transmissive power generation region SAr, when the display unit 4 is seen from outside, the entire surface has a uniform brightness even when the solar cell C is arranged on the upper side (visible side, front surface side) of the display unit 4. Thus, the thin line power generators 51a are not noticeable, the visibility of display unit 4 is good, and the outward appearance with a good visual quality can be realized.

In the embodiment, the mere description "power generators 51" includes both of the thin line power generators 51a and the other portion of the power generators 51.

Each of the power generators 51 in the solar panel 5 is a layered structure in which a transmissive electrode, a semiconductor layer and a back surface electrode (none of them shown in the drawings) are layered in order on a substrate not shown in the drawings.

The substrate is a thin plate substrate which has a light transmitting property. For example, the substrate is a flexible transmissive plastic in a film form. The material forming the substrate is not limited to this example, and various types of transparent resins, glasses and the like are applied, for example.

The transmissive electrode is formed by crystalizing a zinc oxide, indium oxide or tin oxide, for example. The material and the method to form the transmissive electrode is not limited to this.

The semiconductor layer is formed of amorphous silicon (a-Si:H), for example. As the semiconductor layer, for example, there is used a p-n junction type semiconductor in which a p-type semiconductor is joined to an n-type semiconductor.

The back surface electrode is formed including a metal material such as an aluminum conductor, for example. The material forming the back surface electrode is not limited to this.

The semiconductor layer and the back surface electrode are formed to be layered on the substrate by a method such as vapor deposition, for example. The method to provide the semiconductor layer and the back surface electrode on the substrate is not limited to this.

The thinness (size in the width direction orthogonal to the extending direction L) of each of the thin line power generators 51a arranged in the light transmissive power generation region SAr is not particularly limited. The thinness of a thin line power generator 51a is approximately 10 μm when the thinness (size in the width direction orthogonal to the extending direction L) of a transmissive region 52 is approximately 70 μm, for example.

As the width of a thin line power generator 51a is made smaller (thinner) and the width of a transmissive region 52 is made larger (thicker), the light transmitting degree in the light transmissive power generation region SAr in the solar panel 5 becomes higher and the visibility of the visible region VAr of the display unit 4 is improved. On the other hand, as the width of a thin line power generator 51a is made smaller, the power generation amount is smaller and the resistance when the electric charges move in the solar cell C becomes larger, which reduces the power generation efficiency.

Thus, the width of the thin line power generator 51a and the width of transmissive region 52 are appropriately set according to a balance between the degree of visibility required for the visible region VAr of the display unit 4 (that is, the degree of light transmitting property of the light transmissive power generation region SAr which is provided to correspond to the visible region VAr) and the degrees of the power generation amount and the power generation efficiency required for the solar panel 5.

The periphery power generation region PAr is a ring-shaped region which is provided to surround the periphery of the light transmissive power generation region SAr.

In the present embodiment, the periphery power generation region PAr is divided into eight blocks along the circumferential direction.

Each of the blocks is in a nearly fan shape, and the blocks form respective solar cells C (solar cells C1 to C8).

The solar panel 5 includes connection parts (not shown in the drawings) which electrically connect the solar cells C to each other in series. In the present embodiment, the connection parts connecting respective blocks are provided in the periphery power generation region PAr. By connecting the blocks, the solar cells C as an integrated unit form the solar panel 5.

In the present embodiment, the connection parts are arranged outside the above-mentioned visible region VAr so as not to be visible from outside.

As indicated by the thick arrows in FIG. 3, it is preferable to connect the solar cells C (block parts) arranged in the periphery power generation region PAr such that the electric charges move along the circumferential direction of the bezel 6 which is a ring-shaped member that functions as the antenna.

The solar panel 5 includes two terminals 55. The terminal 55 on one side is electrically connected to the positive electrode on the substrate (not shown in the drawings) provided to the module or the like, and the terminal 55 on the other side is electrically connected to the minus electrode on the substrate.

Though the arrangement of the terminals 55 is not particularly limited, FIG. 3 shows an example of arranging the terminals 55 at the ends of the solar cell C1 and the solar cell C8, respectively.

The number of cells (solar cells C) to form the solar panel 5 is not particularly limited. FIG. 3 shows an example of forming the solar panel 5 by connecting in series eight cells C (solar cells C1 to C8 in FIG. 3).

As the number of solar cells C connected in series is larger, the voltage of the entire solar panel 5 is higher. Thus, it is preferable to set the number of solar cells C forming the solar panel 5 appropriately according to the required voltage level such as the voltage of secondary cell storing the power generated by the solar panel 5.

At least a part of the plurality of solar cells C1 to C8 is a composite cell which is configured by including at least a part of the periphery power generation region PAr (block portion forming the periphery power generation region PAr) and at least a part of the light transmissive power generation region SAr.

In the composite cell, the light transmissive power generation region SAr functions as a part of the solar cell C via the portion of the periphery power generation region PAr, and the light transmissive power generation region SAr is connected to a block (block portion forming the solar cell C) forming the periphery power generation region PAr on one end side in the diameter direction of the bezel 6.

In the present embodiment, the light transmissive power generation region SAr is divided into two regions of upper and lower regions in FIG. 3 by the dividing line along the extending direction L. The solar cell C1 includes a nearly upper half of the light transmissive power generation region SAr in addition to the block of the periphery power generation region PAr. The solar cell C8 includes a nearly lower half of the light transmissive power generation region SAr in addition to the block of the periphery power generation region PAr.

FIG. 3 shows the ranges of the solar cell C1 and the solar cell C8 by surrounding them with thick broken lines.

The solar panel 5 in the present embodiment is configured such that a certain solar cell C (first cell) among the plurality of solar cells C is arranged on one end side in the diameter direction of the bezel 6 which is a ring-shaped member and a solar cell C (second cell) different from the certain solar cell C among the solar cells C is arranged on the other end side in the diameter direction.

For example, one end of the solar cell C1 including a part of the light transmissive power generation region SAr is arranged in the left end portion of the solar panel 5 in FIG. 3, and the solar cells C4 and C5 are arranged in the end portion on the other end side. Similarly, one end of the solar cell C8 including a part of the light transmissive power generation region SAr is arranged in the left end portion of the solar panel 5 in FIG. 3, and the solar cells C5 and C6 are arranged in the end portion on the other end side. One end of the solar cell C6 is arranged in the lower end portion of the solar panel 5 in FIG. 3, and the solar cell C2 is arranged in the end portion on the other end side.

This configuration avoids the state in which a single solar cell C lies across the region from one end side in the diameter direction of the bezel 6 to the other end side.

When a plurality of solar cells C are connected in series to form a single solar panel 5, the difference in output current value between the solar cells C reduces the output current value of the solar panel 5 according to the solar cell C which has the smallest output current value among the solar cells C.

Thus, in order to raise the power generation efficiency, it is preferable to form the solar cells C such that the areas of the power generators 51 in the respective cells are as equal to each other as possible.

In the present embodiment, as shown in FIG. 3, the area of the block in the periphery power generation region PAr of each of the solar cells C1 and C8 including a part of the light transmissive power generation region SAr is smaller than the area of each of the other blocks. The solar cells C2 to C7 formed of only the blocks of periphery power generation region PAr have areas of blocks nearly equal to each other. Thereby, adjustment is made such that the areas of power generators 51 in the respective solar cells C1 to C8 are nearly equal to each other.

In a configuration of covering a part of the power generators 51 with a member having a low light transmitting property, such as a configuration of providing a logo mark formed of a metal part to a part of the decoration part, the power generation amount of the power generators 51 decreases at the portion having the light transmitting property lowered.

In such a configuration, it is preferable to make each solar cell C have a uniform power generation amount by adjusting the area of each solar cell C at a position not noticeable, for example, by minute adjustment of the shape of solar cell C in the portion which less influences the outward appearance in the periphery of the solar panel 5.

Next, the actions of the solar panel 5 and the timepiece 100 as an electronic device including the solar panel 5 in the present embodiment will be described.

The solar panel 5 in the present embodiment is arranged inside the bezel 6 arranged on the visible side of the timepiece 100. The display unit 4 is arranged on the lower side of the solar panel 5.

The solar panel 5 is arranged such that the light transmissive power generation region SAr corresponds to the visible region VAr of the display unit 4.

The light transmissive power generation region SAr is configured by arranging the thin line power generators 51a and the transmissive regions 52 such that the thin line power generators 51a and the transmissive regions 52 have a uniform longitudinal direction. Thus, even when the solar panel 5 is arranged on the upper side of the display unit 4, the visibility of the display unit 4 is not spoiled, and furthermore the power generators 51 (thin line power generators 51a) can be secured also on the upper side of the display unit 4. Thus, it is possible to increase the power generation amount compared to a configuration of arranging the power generator 51 in only the periphery of the display unit 4.

In the present embodiment, the bezel 6 functions as an antenna. Even when the solar panel 5 shown in the present embodiment is arranged inside the bezel 6, it is possible to successfully receive radio waves of a desired frequency without influencing the antenna characteristic of the bezel 6.

As for the solar panel 5 in the present embodiment not influencing the characteristic of bezel 6 as the antenna, the explanation will be made by using FIGS. 4A, 4B and 5.

Figure 4A:
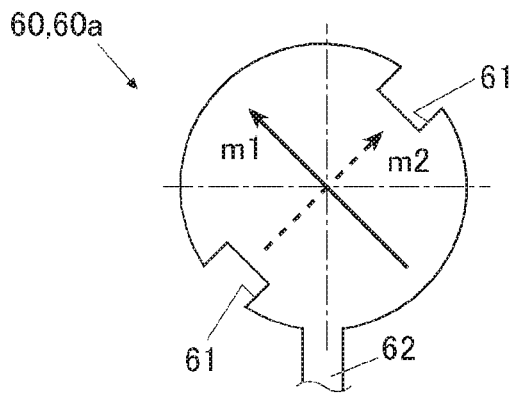
FIG. 4A is an explanation view showing an example of a patch antenna.
Figure 4B:
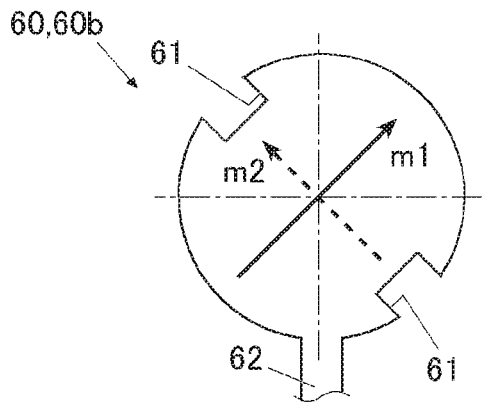
FIG. 4B is an explanation view showing an example of a patch antenna with FIG. 4A.

FIGS. 4A and 4B are explanation views showing a current path of a first mode and a current path of a second mode in an example of a normal circular patch antenna with a single power feeding point. FIG. 5 is a view comparing the resonance characteristic of the first mode with the resonance characteristic of the second mode.

In the present embodiment, the bezel 6 that functions as an antenna is formed in a ring shape as mentioned above. The configuration as the antenna can be regarded as similar to the configuration obtained by removing the central portion from a circular patch antenna as illustrated in FIGS. 4A and 4B as an example.

Thus, with reference to FIGS. 4A, 4B and 5, the concept of generating the circularly polarized wave by the bezel 6 in the present embodiment will be explained.

As shown in FIGS. 4A and 4B, when cuts 61 are provided to portions of the antenna (antenna element) 60, the two electric currents orthogonal to each other (electric current of the first mode M1 and electric current of the second mode M2) are excited on the antenna (antenna element) 60.

Providing the cuts 61 makes the antenna (antenna element) 60 unbalanced. The current path m2 of electric current of the second mode M2 flowing into the side where the cut 61 is provided (indicated by the broken line in each of FIGS. 4A and 4B) is short compared to the current path m1 of electric current of the first mode M1 flowing into the side where the cut 61 is not provided (indicated by the solid line in each of FIGS. 4A and 4B).

Figure 5:
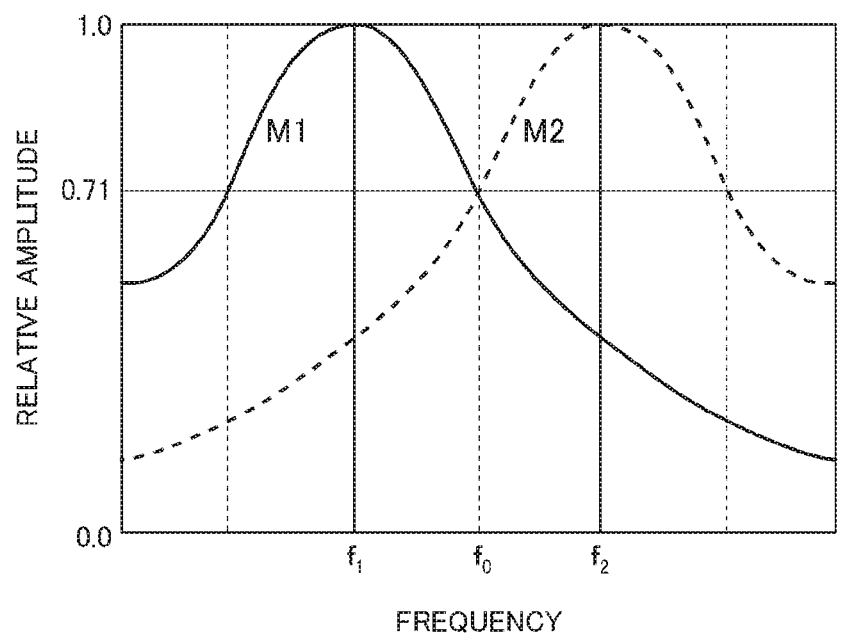
FIG. 5 is a graph for explaining the generation of circularly polarized waves in the patch antenna.

Thus, when comparing the resonance characteristics between the first mode M1 and the second mode M2, as shown in FIG. 5, the resonance frequency f1 of the first mode M1 is lower than the resonance frequency f2 of the second mode M2. When the area of cut 61 is set such that the resonance characteristics of the two modes have an intersection at the frequency f0 which is the doubling point with respect to the amplitude at the time of resonance, the phase difference between the first mode M1 and the second mode M2 at the frequency f0 is a value around $\pi/2$. The radiated fields with these modes as wave sources are spatially combined and thereby a circularly polarized wave is generated.

In the antenna (antenna element) 60a in which the cuts 61 are arranged as shown in FIG. 4A, the right-handed polarized wave is radiated. In the antenna (antenna element) 60b in which the cuts 61 are provided as shown in FIG. 4B at the positions symmetrical to the positions shown in FIG. 4A with respect to the power feeding point 62, the left-handed polarized wave is radiated.

The bezel 6 in the present embodiment is also based on the similar concept, and the shapes of respective components or the like are adjusted so as to generate a desired circularly polarized wave (for example, right-handed circularly polarized wave when the GPS radio waves are to be received).

In this configuration, when a solar panel is arranged inside the bezel 6, there is a concern that the balance which is adjusted and set in the bezel 6 (balance which is set for generating the desired circularly polarized wave) collapses if the solar panel is divided into solar cells in strip shapes over the range from one end to the other end in the diameter direction of the bezel 6 along the extending direction L of the thin line power generators 51a for example.

That is, in the solar cell in a strip shape as described above, the electric charge moves along the extending direction L of the thin line power generators 51a, and the direction of current flow is firmly determined. Thus, there is a concern of capacitive coupling of the ring-shaped bezel 6 with the light transmissive power generation region SAr (solar panel) when the light transmissive power generation region SAr having the thin line power generators 51a is provided over the range from the one end to the other end in the diameter direction of the bezel 6 along the extending direction L. This state is considered to be similar to the state in which the one end side and the other end side in the diameter direction of the bezel 6 are connected via the light transmissive power generation region SAr (solar panel).

Thus, there is a possibility that the balance of the bezel 6 which was adjusted to generate the circularly polarized wave according to a desired frequency (that is, balance for generating a desired circularly polarized wave which is set in the bezel 6 as the current path m1 of the electric current of the first mode M1 and the current path m2 of the electric current of the second mode M2) collapses and the reception of radio waves of the desired frequency cannot be performed. There is also a concern that the capacitive coupling of the bezel 6 with the light transmissive power generation region SAr (solar panel) generates the current path running through the light transmissive power generation region SAr, and the loss caused by the current flow through this current path reduces the gain.

As for this point, the solar panel 5 in the present embodiment is configured such that the light transmissive power generation region SAr having the thin line power generators 51a is not provided over the range from the one end to the other end in the diameter direction of the bezel 6. Thus, the above concerns are not realized.

When the solar panel 5 in the present embodiment is applied to the timepiece 100, the solar panel 5 is arranged at a position which is on the visible side of the timepiece 100 and on the upper side of the display unit 4. Thereby, when light enters via the windshield member 3, the light power generation is efficiently performed in the power generators 51 of the solar cells C1 to C8. The solar cells are connected with the connection parts to form a single solar panel 5. The electric power obtained by the power generation of the entire solar panel 5 is stored in the secondary cell. The electric power which is sufficient for various types of operation parts such as a module motor is supplied from the secondary cell and the timepiece 100 is driven.

On the basis of the GPS radio waves or the like which are received by the bezel 6 that functions as the antenna, time information, position information and the like are obtained as needed.

As described above, according to the present embodiment, the solar panel 5 which is arranged near the bezel 6 configured to resonant with radio waves of a desired frequency and which is divided into a plurality of solar cells C includes a light transmissive power generation region SAr and a periphery power generation region PAr. The light transmissive power generation region SAr is a central region in a diameter direction of the bezel 6, and thin line power generators 51a extending in a certain direction are arranged in parallel in a direction orthogonal to the extending direction in the light transmissive power generation region SAr. The periphery power generation region PAr is a periphery region of the light transmissive power generation region SAr, and parts of the solar cells C are arranged along the circumferential direction in the periphery power generation region PAr. The solar cells C include composite cells each of which is configured by including at least a part of the periphery power generation region PAr (block forming the periphery power generation region PAr) and at least a part of the light transmissive power generation region SAr. A certain solar cell C (first cell) among the solar cells C is arranged on one end side in the diameter direction of the bezel 6, and a solar cell C (second cell) which is different from the certain solar cell C among the solar cells C is arranged on the other end side in the diameter direction.

Thus, by arranging the light transmissive power generation region SAr at a position corresponding to the visible region VAr of the display unit 4, it is possible to secure the visibility of the display unit 4, and increase the power generation amount since the power generation can be performed also in the portion corresponding to the visible region VAr.

Even when the solar panel 5 having the light transmissive power generation region SAr is arranged near the bezel 6 that functions as the antenna (inside the bezel 6 in the present embodiment), it is possible to maintain a good reception state without influencing the antenna characteristic.

In the present embodiment, via a portion of the composite cell in the periphery power generation region, the light transmissive power generation region SAr is connected to a block (block part forming the solar cell C) forming the periphery power generation region PAr on the one end side in the diameter direction of the bezel 6.

Thus, it is possible to efficiently take out electric charges from the light transmissive power generation region SAr. The light transmissive power generation region SAr is not provided over the range from one end to the other end in the diameter direction of the bezel 6, and the antenna characteristic is not influenced when the bezel 6 functions as an antenna.

In the present embodiment, the light transmissive power generation region SAr is divided along the extending direction of the thin line power generators 51*a*.

Thus, when the user sees from outside, the divided parts are not noticeable and it is possible to maintain a good outward appearance.

In the present embodiment, the solar cells C forming the solar panel 5 are divided evenly such that the solar cells C have a same power generation amount.

Thus, it is possible to reduce the difference in output current value between the solar cells C, have the maximum output current value as the entire solar panel 5, and improve the power generation efficiency.

In the present embodiment, the solar cells C (blocks forming the solar cells C) which are arranged in the periphery power generation region PAr are connected such that electric charges move along the circumferential direction of the bezel 6 that functions as the antenna.

Thus, suppressing the influence on the bezel 6 by the solar panel 5 to be small can be expected.

Though the embodiment of the present invention has been described, the present invention is not limited to this embodiment and various modifications can be made within the scope of the present invention.

For example, the present invention is not limited to the configuration in which the light transmissive power generation region SAr is divided into two regions.

As shown in FIG. 6, in a solar panel 501, the light transmissive power generation region SAr may not be divided, and the light transmissive power generation region SAr may be connected to a solar cell C (one block forming the solar cell C) in the periphery power generation region PAr to form a solar cell C11.

In this configuration, for the amount of area of the solar cell C11 covering the entire light transmissive power generation region SAr, the area of the block part connected to the light transmissive power generation region SAr among the block parts in the periphery power generation region PAr is adjusted to be smaller than the area of each of the other block parts so that each of the solar cells C has a nearly equal area.

In such a way, it is possible to make the configuration of solar panel 501 simpler by not dividing the light transmissive power generation region SAr.

As shown in FIG. 7, when a light transmissive power generation region SAr forming a solar panel 502 is divided into a plurality of (for example, two in FIG. 7) regions, the block parts in the periphery power generation region PAr in the respective composite cells (parts in the periphery power generation region PAr connected to the respective light transmissive power generation regions SAr which are divided) may be arranged at point-symmetric positions with respect to the center of the ring shape of the bezel 6.

In such a way, when the light transmissive power generation region SAr is divided into a plurality of (two in the present embodiment) regions, by arranging the block parts in the periphery power generation region PAr forming the composite cells at the point-symmetric positions with respect to the center of the ring shape of the bezel 6, the balance for fulfilling the function as the antenna of the bezel 6 arranged around the solar panel 5 is less badly influenced.

The number of divided regions of the light transmissive power generation region SAr and the number of block parts in the periphery power generation region PAr assigned to form the composite cells are set as needed.

The shape of the solar panel 5 is not limited to the nearly circle shown in the above embodiment.

For example, the shape of the solar panel 5 may be an oval or a polygon.

The shape of each solar cell C forming the solar panel 5 is also not limited to the shape shown in the above embodiment.

The present embodiment shows, as an example, a configuration in which the thin line power generator 51*a* is a power generator 51 which is formed in a thin straight line shape extending along a fixed direction L. However, the shape of the thin line power generator 51*a* is not limited to this.

For example, the thin line power generator 51*a* may be formed in a concentric circle, a spiral, a radial form or the like.

In these configurations, the periphery power generation region PAr is arranged around the light transmissive power generation region SAr including the thin line power generators 51*a* and a block forming the periphery power generation region PAr is connected to the light transmissive power generation region SAr so as to enable collection of the electric charges generated by the thin line power generators 51*a*.

The present embodiment shows, as an example, a configuration in which the bezel 6 formed in a ring shape functions as an antenna and the solar panel 5 is arranged inside the bezel 6. However, the shape and arrangement of the antenna and the position relationship between the solar panel 5 and the antenna are not limited to this example.

For example, the antenna may be arranged above or below the solar panel 5.

By configuring the solar panel 5 as shown in the above embodiment, even when the antenna is arranged above or below the solar panel, the capacitive coupling between the antenna and the solar panel 5 does not easily occur, the antenna characteristic is not influenced, and thus it is possible to maintain a good reception state.

The present embodiment shows, as an example, a configuration in which the solar panel 5 is incorporated into the timepiece 100. However, the electronic device to incorporate the solar panel 5 is not limited to the timepiece 100.

It is possible to widely apply the solar panel 5 to any device as long as the device performs power generation by the solar panel 5 and operates with the generated electric power as the drive source. For example, the solar panel 5 may be applied to biological information display devices such as a pedometer, a heart rate meter and a pulse rate meter, and various types of electronic devices which display various types of information such as a movement distance, movement pace information, altitude information and air pressure information, and the like.

Although some embodiments of the present invention have been described and illustrated in detail, the disclosed embodiments are made for purposes of illustration and example only and not limitation. The scope of the present invention includes the scope of the present invention described in the scope of claims and the equivalents thereof.

What is claimed is:

1. A solar panel comprising:
   a plurality of cells arranged within a ring-shaped member, the ring-shaped member being configured to resonate with radio waves of a frequency,
   wherein a space within the ring-shaped member defines:
      a light transmissive power generation region in a central region in a diameter direction of the ring-shaped member; and
      a periphery power generation region in a periphery of the light transmissive power generation region,
   wherein a first cell of the plurality of cells is arranged on one end side in the diameter direction of the ring-shaped member,
   wherein the first cell is a composite cell including at least a part of the light transmissive power generation region in which thin line power generators are arranged, and a part of the periphery power generation region,
   wherein the thin line power generators are configured to extend in an extending direction, and each of the thin line power generators is arranged in parallel in a direction substantially orthogonal to the extending direction, and
   wherein a second cell of the plurality of cells is configured by including a part of the periphery power generation region, and arranged on an other end side in the diameter direction of the ring-shaped member in the periphery power generation region, and the second cell does not include the light transmissive power generation region in which the thin line power generators are arranged.

2. The solar panel according to claim 1,
   wherein the light transmissive power generation region is connected to a cell among the plurality of cells in the periphery power generation region on the one end side in the diameter direction of the ring-shaped member, via a portion of the composite cell in the periphery power generation region.

3. The solar panel according to claim 2,
   wherein the light transmissive power generation region is divided into at least two regions, and
   wherein portions of respective two cells in the periphery power generation region are respectively arranged at point-symmetric positions with respect to a center of a ring shape of the ring-shaped member.

4. The solar panel according to claim 3,
   wherein the light transmissive power generation region is divided along the extending direction of the thin line power generators.

5. The solar panel according to claim 1,
   wherein the plurality of cells are divided evenly such that the plurality of cells have a same power generation amount.

6. The solar panel according to claim 1,
   wherein cells arranged in the periphery power generation region among the plurality of cells are connected such that an electric charge moves along the circumferential direction of the ring-shaped member which functions as an antenna.

7. An electronic device comprising:
   the solar panel according to claim 1; and
   the ring-shaped member comprising a bezel.

8. An electronic timepiece comprising:
   the solar panel according to claim 1; and
   the ring-shaped member comprising a bezel.

* * * * *